United States Patent
Khan

(10) Patent No.: US 8,304,756 B2
(45) Date of Patent: Nov. 6, 2012

(54) DEEP ULTRAVIOLET LIGHT EMITTING DEVICE AND METHOD FOR FABRICATING SAME

(75) Inventor: Asif Khan, Irmo, SC (US)

(73) Assignee: Nitek, Inc., Irmo, SC (US)

( * ) Notice: Subject to any disclaimer, the term of this patent is extended or adjusted under 35 U.S.C. 154(b) by 578 days.

(21) Appl. No.: 12/445,959

(22) PCT Filed: Oct. 17, 2007

(86) PCT No.: PCT/US2007/081625
§ 371 (c)(1),
(2), (4) Date: Apr. 17, 2009

(87) PCT Pub. No.: WO2008/054994
PCT Pub. Date: May 8, 2008

(65) Prior Publication Data
US 2010/0320440 A1    Dec. 23, 2010

(51) Int. Cl.
*H01L 29/06* (2006.01)

(52) U.S. Cl. .............. 257/13; 257/76; 257/78; 257/94; 257/E21.093

(58) Field of Classification Search .............. None
See application file for complete search history.

(56) References Cited

U.S. PATENT DOCUMENTS

| | | | |
|---|---|---|---|
| 6,426,519 | B1 | 7/2002 | Asai et al. |
| 6,492,193 | B1 | 12/2002 | Edmond et al. |
| 2002/0028314 | A1 | 3/2002 | Tischler et al. |
| 2002/0090816 | A1 | 7/2002 | Ashby et al. |
| 2004/0224484 | A1 | 11/2004 | Fareed et al. |
| 2006/0027814 | A1 | 2/2006 | Watanabe et al. |
| 2006/0151798 | A1 | 7/2006 | Nitta et al. |
| 2006/0175600 | A1 | 8/2006 | Sato et al. |
| 2010/0264401 | A1* | 10/2010 | Adivarahan et al. ............ 257/13 |

FOREIGN PATENT DOCUMENTS

| | | |
|---|---|---|
| CA | 2487149 | 1/2004 |
| JP | 2001-217506 | 8/2001 |
| JP | 2004-186509 | 2/2004 |

OTHER PUBLICATIONS

Yoshima Okada, Office Action, Patent Application No. 2009-533501; Sep. 20, 2011, Japanese Patent Office, Original and Translation.

Zhang et al. "Pulsed Atomic Layer Epilaxy of Ultrahigh-quality ALxGa1-xN Structures for Deep Ultraviolet Emissions Below 230 nm" Applied Physics Letters, vol. 81, No. 23 pp. 4392-4394—Dec. 2, 2002.

* cited by examiner

*Primary Examiner* — Benjamin Sandvik
*Assistant Examiner* — Scott R Wilson
(74) *Attorney, Agent, or Firm* — Joseph T. Guy; Nexsen Pruet, LLC

(57) ABSTRACT

An ultra-violet emitting light-emitting device and method for fabricating an ultraviolet light emitting device (LED) with an AlInGaN multiple-quantum-well active region exhibiting stable cw-powers. The LED includes a template with an ultra-violet light-emitting structure on it. The template includes a first buffer layer on a substrate, then a second buffer layer on the first preferably with a strain-relieving layer in both buffer layers. Next there is a semiconductor layer having a first type of conductivity followed by a layer providing a quantum-well region with an emission spectrum ranging from 190 nm to 369 nm. Another semiconductor layer having a second type of conductivity is applied next. Two metal contacts are applied to this construction, one to the semiconductor layer having the first type of conductivity and the other to the semiconductor layer having the second type of conductivity, to complete the LED.

45 Claims, 2 Drawing Sheets

DEEP ULTRAVIOLET LIGHT EMITTING DEVICE AND METHOD FOR FABRICATING SAME

BACKGROUND OF THE INVENTION

The present invention relates generally to an ultraviolet light-emitting device and method of manufacturing a light-emitting device.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting diode or a laser diode that emits blue light may be used for displays, for lighting and for high-density optical disk devices. A light-emitting device (which together with the acronym LED, when used herein, will for convenience also refer to both a light-emitting diode and laser diode unless otherwise specified) that emits ultraviolet radiation is expected to find applications in the field of ultraviolet curing, phototherapy, water and air purification, bio-detection, and germicidal treatment. The ultraviolet portion of the electromagnetic spectrum is often subdivided by wavelength into UVA (315-380 nm), UVB (280-315 nm) and UVC (<280 nm).

These LEDs are difficult to manufacture for a number of reasons. For example, defects arise from lattice and thermal mismatch between the group III-Nitride based semiconductor layers and a substrate such as sapphire, silicon carbide, or silicon on which they are constructed. In addition, impurities and tilt boundaries result in the formation of crystalline defects. These defects have been shown to reduce the efficiency and lifetime of LEDs and LDs fabricated from these materials. These defects have been observed for III-Nitride films grown heteroepitaxially on the above mentioned substrates with typical dislocation densities ranging from $10^8$ cm$^{-2}$ to $10^{10}$ cm$^{-2}$ for films grown via metal-organic chemical vapor deposition (MOCVD), molecular beam epitaxy (MBE), hydride vapor phase epitaxy (HVPE) and several other less common growth techniques. Reducing the dislocation density has accordingly become an important goal.

One way to reduce the dislocation density is based on the use of epitaxial lateral overgrowth (ELOG), which is a well-known technique in the prior art. With this method, the dislocation density can be reduced to about $10^5$ cm$^{-2}$ to $10^6$ cm$^{-2}$. This method, however, has been shown to be ineffective for the growth of aluminum-containing III-Nitride based semiconductors because of the tendency for the aluminum to stick to the masked material and disrupt the lateral overgrowth. Several variations of this approach have also been demonstrated including PENDEO epitaxy, and FACELO growth. All of these techniques suffer from the same limitation as the ELOG approach for aluminum containing III-Nitride materials.

Additionally, a technique called cantilever epitaxy involves growth from pillars that are defined through etching as opposed to, for example, masking.

Several other approaches to dislocation reduction have been reported that do not involve selective area growth including inserting an interlayer between the substrate and the semiconductor layer to relieve strain, filtering dislocations by bending them into each other by controlling surface facet formation or by inserting a Group III-Nitride super-lattice layer as described in Applied Physics Letters, Jul. 22, 2002; Volume 81, Issue 4, pp. 604-606, between the buffer layer and the active layer.

Accordingly, several research groups at present are developing III-nitride deep ultraviolet (DUV) light emitting diodes (LEDs) for applications in air and water purification and bio-medical systems. Milli-watt power DUV LEDs on sapphire substrates with AlGaN multiple quantum well (MQW) active regions have been previously reported for the UVA, UVB and the UVC regions. The LED design used in the prior art benefited from several key innovations, namely: (1) the use of pulsed atomic layer epitaxy (PALE) to improve the quality of the buffer AlN layer; (2) the use of a PALE deposited AlN/Al$_x$Ga$_{1-x}$N, short-period super-lattice layer insertion between the buffer AlN and the n-contact AlGaN layer for controlling the thin-film stress and mitigating epilayer cracking; and (3) a p-GaN/p-AlGaN hetero-junction contact layer for improved hole injection.

To date, under a cw-pump current of 20 mA, the average output powers for state-of-the-art UVC LEDs are about 1 mW. These LEDs typically have effective areas ranging from approximately 200 µm×200 µm to 300 µm×300 µm with various geometrical shapes demonstrated. Due to the poor thermal conductivity of the sapphire substrates, the output power quickly saturates at pump currents around 40-50 mA. At 20 mA pump current, the device lifetimes (50% power reduction) are approximately 1000 h for packaged devices that are flip-chipped to a heat sink. Without being constrained by theory, the key reasons for this power/lifetime limitation are the dislocations in the active region and the excessive heating due to the poor thermal conductivity of sapphire. Unfortunately, many commercial applications, however, require the output powers and lifetimes to be significantly better than the best values reported to date.

Currently, several research groups are actively developing low-defect density AlN substrates to improve the power-lifetime performance of the deep UV LEDs. There are reports on a new air-bridge-assisted, high-temperature (1500° C.) lateral epitaxy approach to deposit 12-µm thick, high-quality AlN layers over SiC substrates as templates for the DUV LEDs. Pulsed lateral overgrowth (PLOG) of Al$_x$Ga$_{1-x}$N has previously been demonstrated as an approach for depositing 15-20 µm thick Al$_x$Ga$_{1-x}$N over basal plane sapphire substrates. Instead of the high temperature approach, a pulsed growth mode at 1150° C. was used to enhance Al-precursor mobilities over the growth surface. These pulsed, laterally overgrown (PLOG), Al$_x$Ga$_{1-x}$N layers show a significantly reduced number of threading dislocations ($\sim10^7$ cm$^{-2}$) in the lateral-overgrowth regions, which enabled demonstration of optically-pumped lasing at 214 nm. In previous reports, the PLOG Al$_x$Ga$_{1-x}$N was grown either from shallow ($\sim0.3$ µm) trenched sapphire or from thin AlN etched templates ($\sim0.3$ µm).

However, there remains a need for a higher quality, more reliable, more robust, deep UV light-emitting diodes and laser diodes.

SUMMARY OF THE INVENTION

The present invention is an ultra-violet light-emitting device and method for fabricating an ultraviolet light emitting device. In a preferred embodiment, the present invention is a deep ultra-violet light-emitting structure ($\lambda_{peak}$=200-369 nm) with an Al$_x$In$_y$Ga$_{1-x-y}$N, wherein 0<x≦1, 0≦y≦1, and 0<x+y≦1, quantum-well active region on a template. The template may include a substrate but has two buffer layers, one of which is trenched and the second of which forms a coalesced planar layer over the first. The coalescing involves performing PLOG over deep trenches (height≧0.4 µm in case of AlN), or over shallow or deep trenches if the pillars encompass more than one group III species or a combination of multiple layers. The pillars may consist of a multi-layer stack of III-Nitride based semiconductors including AlN, and a strain-relieving superlattice. In some embodiments additional layers are included in the pillars on top of the superlattice including $Al_xIn_yGa_{1-x-y}N$ (wherein $0<x\leq1$, $0\leq y\leq1$, and $0<x+y\leq1$), and additional superlattices with different average composition than the first superlattice. The second buffer layer, of AlN or $Al_xIn_yGa_{1-x-y}N$ (wherein $0<x\leq1$, $0\leq y\leq1$ and $0<x+y\leq1$), is grown by PLOG techniques over the etched pillars until it coalesces to form a planar surface. The ultraviolet light-emitting structure deposited on top of the planar surface on the template consists of PALE or conventional MOCVD deposited AlN, and in some embodiments an additional strain relief superlattice is deposited on the AlN. A thick (thickness$\geq1.5$ μm) undoped or n-type $Al_xIn_yGa_{1-x-y}N$ (wherein $0<x\leq1$ and $0\leq y\leq1$, and $0<x+y\leq1$) layer is deposited next. If the $Al_xIn_yGa_{1-x-y}N$ (wherein $0<x\leq1$, $0\leq y\leq1$ and $0<x+y\leq1$) is undoped, an additional n-type $Al_xIn_yGa_{1-x-y}N$ (wherein $0<x\leq1$ and $0\leq y\leq1$) layer is deposited. This is followed by the quantum well active region and p-type $Al_xIn_yGa_{1-x-y}N$ (wherein $0\leq y\leq1$, $0\leq y\leq1$ and $0\leq x\leq y\leq1$) materials that form the top electrode for the light emitting device. Without wishing to be bound by theory, the superior performance of the present light-emitting diodes is attributed to the combination of reduced thermal impedance from the thick PLOG growth AlN or $Al_xIn_yGa_{1-x-y}N$ (wherein $0<x\leq1$, $0\leq y\leq1$ and $0<x+y\leq1$) material, and a lower overall defect density in the laterally overgrown AlN or $Al_xIn_yGa_{1-x-y}N$ (wherein $0<x\leq1$, $0\leq y\leq1$ and $0<x+y\leq1$) buffer.

The present diode derives its reduced defect density when a group III-Nitride epitaxial layer is used in conjunction with a patterned template, where the template consists of a substrate such as sapphire with a single or multi-layer first buffer of III-Nitride semiconductor layers that are etched into pillars. The low defect density III-Nitride second buffer layer is formed thereover by using a pulsed lateral overgrown III-Nitride layer.

The present method includes the steps of depositing a single or multiple layer buffer on the substrate, trenching the buffer layer, applying an AlInGaN second buffer layer to the trenched buffer using pulsed lateral overgrowth techniques to form the template. Next, a deep ultraviolet light emitting structure (190 nm to 369 nm) is applied onto the template.

A feature of the present invention is that the buffer layer of the present invention can be either a single III-Nitride layer that is not thin (thickness>0.3 μm) for AlN, or consist of ternary (AlGaN, AlInN), quaternary (AlInGaN) or multiple layers of III-Nitride, preferably made of AlInGaN and containing a design optimized for both strain relief and optical transparency. In the prior art, the buffer layer consists of thin AlN in a single layer. Another feature is the use of the superlattice for both reducing defects and relieving strain. A superlattice is a series of thin layers of alternating composition that serves as a transducer from a lower layer to an upper layer, relieving stress and shifting the intralattice geometry from the first to the second layer.

Another feature of the present invention is the formation of deep trenches (depth$\geq0.4$ μm) before performing the PLOG growth. Etch depth was 0.3 μm in the prior art and this shallow etch depth limited the amount of lateral overgrowth that could be successfully performed because growth also takes place in the trenches. The prior art also encompassed pillars that were either AlN, or etched sapphire. In the present invention, the pillars can consist of either a single AlInGaN layer, or multiple AlInGaN layers with the etch depth greater than or equal to 0.1 μm, including any etching that occurs into the substrate.

As noted above the prior art teaches a technique referred to as cantilevered epitaxy but this technique differs from the current invention in that it does not involve pulsing of the growth species, which provides significant benefit for enhancing lateral growth, does not involve integration of strain relief structures within the etched pillars, and does not describe the methods of formation to achieve electrically injected light emitting structures on the reduced defect material.

Yet another feature of the present invention is the growth of a thick, doped or undoped, AlInGaN layer on top of the PLOG buffer, but below the light emitting diode AlInGaN:Si n-contact layer, such that the thickness of the AlInGaN layer is greater than or equal to 1 μm.

Other features and their advantages will be apparent to those skilled in the art of semi-conductor design and light-emitting diodes in particular from a careful reading of the foregoing Detailed Description of Preferred Embodiments, accompanied by the following drawings.

DETAILED DESCRIPTION OF PREFERRED EMBODIMENTS

Figure 4:
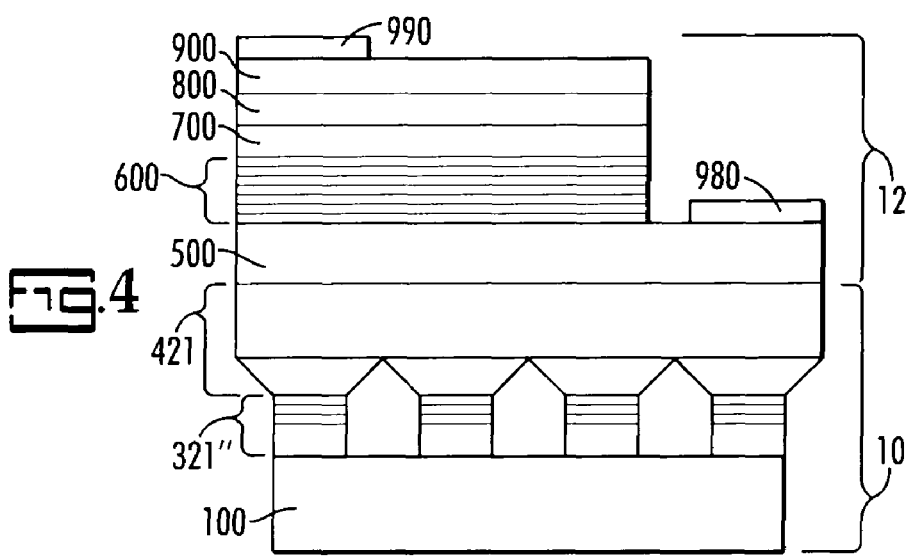
FIG. 4 is a schematic diagram of the epilayer structure of a light-emitting diode, according to a preferred embodiment of the present invention.

The present invention is a light-emitting device (LED) and a method for making an LED, particularly one that emits deep ultraviolet light. In particular, it is a template 10 that serves as a platform for an ultraviolet light-emitting structure 12 as shown in FIG. 4. Briefly, template 10 includes a substrate, and a first buffer layer added onto the substrate as the first step in forming the LED wafer. The first buffer layer is then etched to form a pattern of trenches with etch depth greater than or equal to 0.4 μm if the buffer is AlN and the substrate is sapphire, or greater than or equal to 0.1 μm if the first buffer layer consists of one or more AlInGaN layers. After patterning the wafer, a second buffer is applied to the first buffer to cause the patterned wafer to coalesce. Next, the ultraviolet light-emitting structure 12 is applied to template 10. First, a semiconductor layer having a first type of conductivity is applied, followed by several layers forming a quantum-well region with an emission spectrum ranging from 190 nm to 369 nm. Another semiconductor layer, or possibly more than one, having a second type of conductivity is applied next. Two metal contacts are applied to this construction, one to the semiconductor layer having the first type of conductivity and the other to the semiconductor layer having the second type of conductivity, to complete the LED. Each of these layers will be described in detail below.

Figure 1:
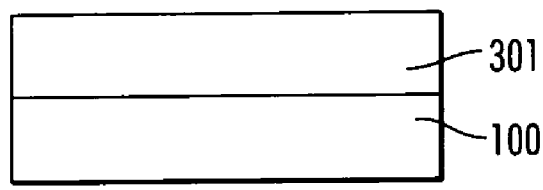
FIG. 1 is a schematic diagram of the epilayer structure of portion of a light-emitting diode having a single III-Nitride buffer layer, according to a preferred embodiment of the present invention.
Figure 2A:
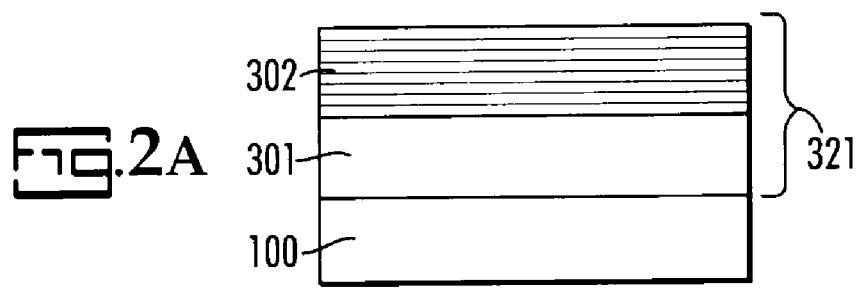
FIG. 2a is a schematic diagram of the epilayer structure of a portion of a light-emitting diode having multiple III-Nitride buffer layers, according to a preferred embodiment of the present invention.
Figure 2B:
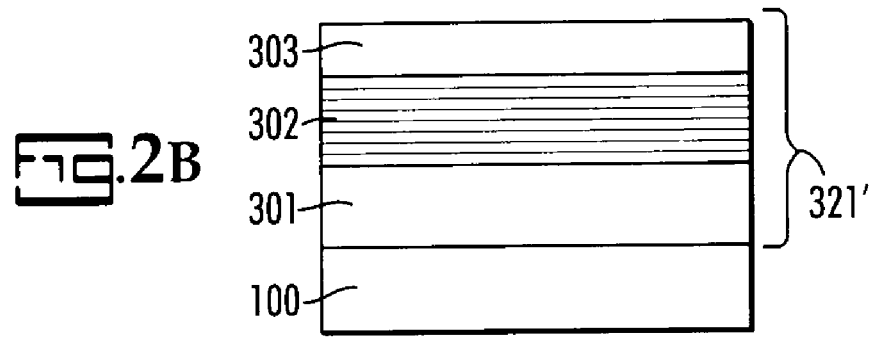
FIG. 2b is a schematic diagram of the epilayer structure of a portion of a light-emitting diode having multiple III-Nitride buffer layers, according to another preferred embodiment of the present invention.
Figure 2C:
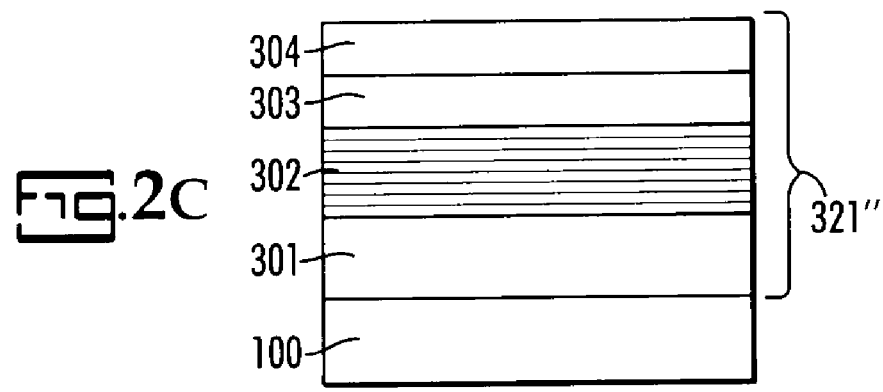
FIG. 2c is a schematic diagram of the epilayer structure of a portion of a light-emitting diode having multiple III-Nitride buffer layers, according to another preferred embodiment of the present invention.

Several of the layers and buffer layers are applied using a pulsed atomic layer epitaxy (PALE) growth technique, and the layer grown on the patterned wafer is grown using pulsed lateral overgrowth techniques. Each layer other than the substrate, which is preferably sapphire, is made of a Group III-nitride, preferably $Al_xIn_yGa_{1-x-y}N$ (wherein $0<x\leq1$, $0\leq y\leq1$ and $0<x+y\leq1$). In employing pulsed lateral overgrowth techniques, the precursor sources include a metal-organic source (preferably trimethyl aluminum, trimethyl gallium, triethyl gallium, trimethyl indium, ammonia, a carrier gas (such as hydrogen and/or nitrogen) and, optionally, doping sources such as silane, and/or biscyclopentadienyl magnesium FIGS. 1-3 show various embodiments of template 10 of the present LED as it is constructed. As shown in FIG. 1, a first buffer layer 301 is grown on a substrate 100, preferably sapphire. First buffer layer 301 is made of a Group III-Nitride material, preferably $Al_xIn_yGa_{1-x-y}N$ (wherein $0<x\leq1$, $0\leq y\leq1$ and $0<x+y\leq1$). Alternatively, as shown in FIG. 2A-2C, a first buffer layer 321 may actually be made of multiple sub-layers. FIGS. 2A, 2B, and 2C show three different implementations of first buffer layer 321, 321' and 321", respectively, using sub-layers 301, 302, 303, 304 of a Group III-Nitride material, preferably $Al_xIn_yGa_{1-x-y}N$ (wherein $0<x\leq1$, $0\leq y\leq1$ and $0<x+y\leq1$). Sub-layer 301 is preferably made of $Al_xIn_yGa_{1-x-y}N$ (wherein $0<x\leq1$, $0\leq y\leq1$ and $0<x+y\leq1$); Sub-layer 302 is preferably an AlInGaN/AlInGaN super-lattice. Sub-layer 303 is preferably undoped AlInGaN while sub-layer 304 is AlInGaN doped with silicon. Buffer layer 321 in FIG. 2A includes sub-layers 301 and 302. Buffer layer 321' in FIG. 2B in includes sub-layers 301, 302, and 303. Buffer layer 321" in FIG. 2C includes sub-layers 301, 302, 303, and 304.

The first III-Nitride buffer layer 321 is grown to approximately 0.1-5 μm thick, depending on the composition and sequence of layers used, over a substrate 100 using a combination of the pulsed atomic layer epitaxy (PALE) technique and conventional metal-organic chemical vapor deposition (MOCVD). First buffer layer 321 is preferably formed of at least one sub-layer of $Al_xIn_yGa_{1-x-y}N$, wherein (wherein $0<x\leq1$, $0\leq y\leq1$ and $0<x+y\leq1$)

Next, a portion of the final LED epilayer is trenched. The trenching is done in first buffer layer 321, and may also extend into substrate 100. The trenching process is performed using standard photolithographic techniques in combination with either wet or dry etching processes that are well established in the prior art. However, the trenches can be much deeper than in the prior art. In particular, the trenches are at least 0.4 μm deep if first buffer layer is made of AlN and at least 0.1 μm deep if first buffer layer 321, 321' or 321" are used.

Figure 3A:
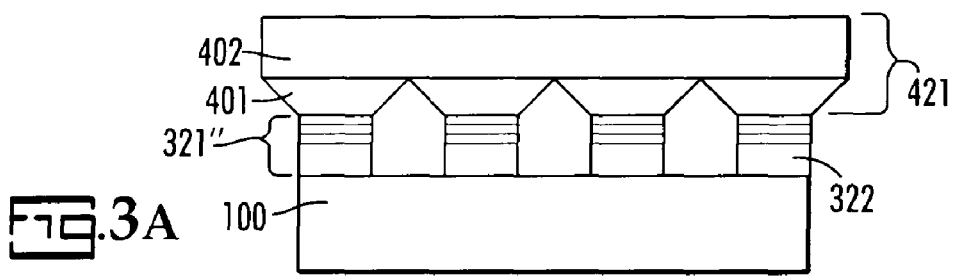
FIG. 3a is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.
Figure 3B:
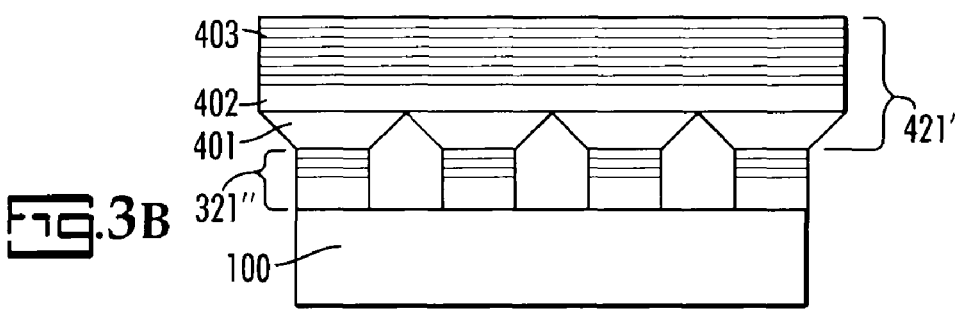
FIG. 3b is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.
Figure 3C:
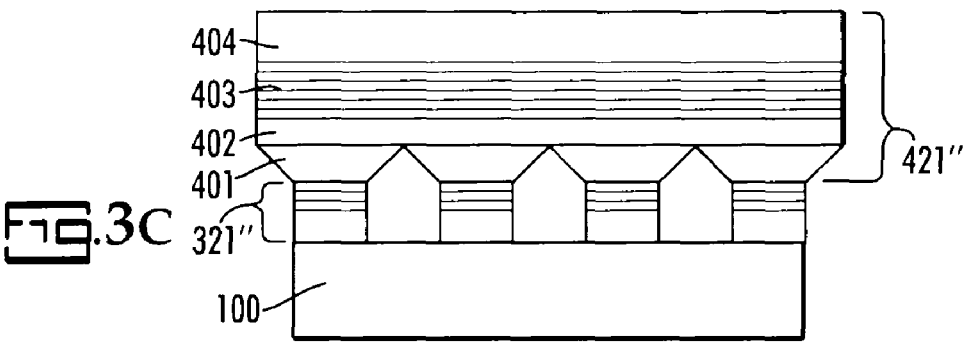
FIG. 3c is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.

Trenching is the selective removal of material leaving narrow strips of material or pillars remaining as seen in FIGS. 3A-3C. These narrow strips may be straight or curved but are preferably parallel and most preferably patterned, such as for example in stripes, circles, hexagons, squares or rectangles. After patterning a layer 401 is applied to the first buffer by pulsed lateral overgrowth techniques so that it will grow laterally, bridging the gaps between the stripes as illustrated in FIG. 3A-3C. Layer 401 is preferably made of $Al_xIn_yGa_{1-x-y}N$ (wherein $0<x\leq1$, $0\leq y\leq1$ and $0<x+y\leq1$). After the layer 401 is completed, as shown for each of the three embodiments illustrated in FIG. 3A-3C, additional layers may be deposited to complete alternate preferred embodiments of second buffer layers 421, 421' and 421".

FIG. 3A shows one implementation of a second buffer, 421, on top of the epilayer construction shown in FIG. 2C, after trenching first buffer layer 321" to form pillars 322. (Any first buffer layer: 321, 321' or 321", could be used, but only the epilayer of FIG. 2C, namely with first buffer layer 321", is shown in FIGS. 3A-3C in order to simplify the drawings. FIGS. 3B and 3C show additional implementations of the second buffer 421, namely, 421' and 421", in FIGS. 3B and 3C, respectively, with sub-layers 401, 402, 403, and 404 shown in particular combinations in each of FIGS. 3A-3C. FIG. 3A shows second buffer layer 421 includes sub-layer 401 and sub-402; FIG. 3B shows second buffer layer 421' includes sub-layer 401, 402, and 403; and FIG. 3C shows second buffer layer 421" includes sub-layer 401, 402, 403, and 404.

FIG. 4 illustrates template 10 of FIG. 3C, now with a layered, UV-emitting structure 12 thereon (which UV-emitting structure including layers 500, 600, 700, 800 and 900), as will be described below, plus metal contacts 980 and 990. Except for metal contacts, 990 and 980, and the substrate 100, all layers are made of III-Nitride material. Although preferably made of sapphire, the substrate may be made of silicon carbide, GaN, AlN, AlGaN, InN, InGaN, AlInGaN, Silicon, GaAs, LiAlO3, LiGaO3, ZnO, or a metal. In addition, the substrate has a crystallographic orientation along the C-plane, A-plane, M-plane or R-plane and has a mis-orientation ranging from 0.0° to 10° from its axis.

Buffer layer 321, and in some cases substrate 100, is then trenched. After trenching, the PLOG layer 401 is grown on the buffer layer to cause the wafer surface to coalesce over the formed trenches (see FIGS. 3A, 3B, 3C and 4). The Group III-Nitride PLOG layer 401 is grown by pulsing at least one precursor source to enhance the lateral growth rate over vertical growth rate until PLOG layer 401 is completely coalesced and has regions with dislocation densities less than that of buffer layer 321.

Subsequently, additional AlInGaN layers are deposited after coalescence that together with 401, form a second buffer 421. These layers are shown as 402, 403, and 404 in FIGS. 3A, 3B, and 3C. These layers help to minimize overall strain of the epitaxial layer and also assist with epitaxial planarization that has beneficial effects for the light emitting device active region.

Then, as illustrated in FIG. 4, the LED structure is added to the epilayer beginning with another III-Nitride layer 500 but with a first type of conductivity, applied directly on second buffer 421, preferably an n+ layer made of $Al_xIn_{1-x}Ga_{1-x-y}N$ (wherein $0<x\leq1$, $0\leq y\leq1$ and $0<x+y\leq1$) is formed such that the layer is transparent to light to be emitted from the quantum well active region. Another III-Nitride superlattice layer 600 is then formed which includes one or more barrier and one or more well sub-layers, each having different compositions such that the band-gap of the barrier layer is larger than that of the well layer. The thickness of the barrier and well layers should be between 1-200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Both layers 500 and 600 are given their first type of conductivity using silicon, or are co-doped using a combination of silicon, oxygen, and/or indium. Layer 500 has a band gap lower than the PLOG layer 401 but higher than the quantum well and barrier sub-layers of 600. In some implementations, the well sublayers are undoped.

A p-type AlInGaN electron blocking layer 700 is incorporated directly above the active region layer 600, such that the band-gap of 700 is larger than the bandgap of the barrier sublayer in 600. Magnesium is used as the p-type dopant. Two additional p-type AlInGaN layers 800, and 900, are formed on top of 700 such that the band-gap of the layers decreases for each subsequent layer. Layer 800 may be one single AlInGaN layer, or may consist of a compositionally graded layer, a series of decreasing composition superlattices, or several distinct layers with decreasing bandgap.

A mesa-type LED may then be fabricated, the type shown in FIG. 4, using reactive ion etching (RIE) to access the bottom n+ layer. Note that this type device's geometry results in only a portion of the active area containing low-defect density laterally grown "wing" regions. Finally, probe metal conducting pads 980, 990 are deposited on both the n+ and p+ layers, respectively. Ti/Al/Ti/Au and Ni/Au are used as metal contacts for the n-and p-contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such.

In an alternative configuration, after construction the substrate may be removed by polishing, etching or lifting-off using a laser and then a metallic contact layer can be applied to the backside the n-layer 500. In this configuration, contact 980 is located on the backside of 500 instead of the topside and can be located vertically below the p-contact 990.

It will be apparent to those skilled in the art of ultraviolet light-emitting diodes and laser diodes that many modifications and substitutions can be made to the preferred embodiments described herein without departing from the spirit and scope of the present invention, defined by the appended claims.

What is claimed is:

1. A light-emitting device comprises of a
   a. an ultraviolet light-emitting structure having
      i. a first layer with a first conductivity, and
      ii. a second layer with a second conductivity;
      iii. an light emitting quantum well region between above said first layer and second layer
   b. a first electrical contact in electrical connection with said first layer;
   c. a second electrical contact in electrical connection with said second layer; and
   d. an template serving as a platform for said ultraviolet light-emitting structure, said template having
      i. a first buffer layer, said buffer layer being trenched, and
      ii. a second buffer layer being coalesced over said first buffer layer, said second buffer layer being made of $Al_xIn_yGa_{1-x-y}N$, wherein $0<x\leq1$, $0\leq y\leq1$, $0<x+y\leq1$, whereby, when an electrical potential is applied to said first and second electrical contacts, said device emits ultraviolet light.

2. The light-emitting device of claim 1, wherein said first buffer layer is made of $Al_xIn_yGa_{1-x-y}N$, wherein $0<x\leq1$, $0\leq y\leq1$ and $0<x+y\leq1$.

3. The light-emitting device of claim 1, wherein said first buffer layer is made of at least one superlattice sub-layer having plural layers of $Al_xIn_yGa_{1-x-y}N$, wherein $0<x\leq1$, $0\leq y\leq1$ and $0<x+y\leq1$.

4. The light-emitting device of claim 1, wherein said first buffer layer comprises a first sub-layer made of $Al_xIn_yGa_{1-x-y}N$, wherein $0<x\leq1$, $0\leq y\leq1$ and $0<x+y\leq1$, and wherein said first sub-layer is not doped.

5. The light-emitting device of claim 4, wherein said first buffer layer comprises a second sub-layer made of $Al_xIn_yGa_{1-x-y}N$, wherein ($0<x\leq1$, $0\leq y\leq1$ and $0<x+y\leq1$) that is doped with silicon.

6. The light-emitting device of claim 1, wherein said first buffer layer comprises:
   a first sub-layer made of $Al_xIn_yGa_{1-x-y}N$, wherein $0<x\leq1$, $0\leq y\leq1$ and $0<x+y\leq1$, and wherein said first sub-layer is not doped;
   at least one superlattice sub-layer having plural layers of $Al_xIn_yGa_{1-x-y}N$, wherein $0<x\leq1$, $0\leq y\leq1$ and $0<x+y\leq1$; and
   a second sub-layer made of $Al_xIn_yGa_{1-x-y}N$, wherein $0<x\leq 1$, $0\leq y\leq1$ and $0<x+y\leq1$, and wherein said second sub-layer is doped with silicon.

7. The light-emitting device of claim 6, wherein said first buffer layer further comprises a third sub-layer made of $Al_xIn_yGa_{1-x-y}N$, wherein $0<x\leq1$, $0\leq y\leq1$ and $0<x+y\leq1$, and wherein said third sub-layer is not doped.

8. The light emitting device of claim 1 wherein the first buffer layer comprises $Al_xIn_yGa_{1-x-y}N$ wherein $0.01<x\leq1$, $0\leq y\leq1$, $0.01\leq x+y\leq1$.

9. The light emitting device of claim 1 wherein said first buffer layer and said second buffer layer is deposited in such a way that the group lll and group V materials are injected via a pulsed growth method wherein the group lll and group V materials do not have continuous flow, but are pulsed either sequentially, or such that the group lll source pulses are partially on with no group V source pulse or partially overlap with a group V source pulse.

10. The light-emitting device of claim 1, wherein said second buffer layer further comprises
    a first sub-layer layer coalesced over said first buffer layer to form a first planar layer; and
    a second sub-layer applied to said first sub-layer.

11. The light-emitting device as recited in claim 10 wherein said second sub-layer is a superlattice layer.

12. The light-emitting device as recited in claim 11, further comprising a third sub-layer wherein said third sub-layer is a superlattice layer.

13. The light-emitting device as recited in claim 11, further comprising a fourth sub-layer.

14. The light-emitting device as recited in claim 1, wherein said first electrical contact is carried by said first buffer layer with a first conductivity.

15. The light-emitting device as recited in claim 1, wherein said first electrical contact is carried by said first layer with said first conductivity, and wherein said template further comprises a substrate, said first buffer layer being between said substrate and said second buffer layer.

16. The light-emitting device as recited in claim 1, wherein said first buffer layer is made of AlN and is trenched to a depth of at least 0.4 μm.

17. A light-emitting device comprises of a
 a. an ultraviolet light-emitting structure having
  i. a first layer with a first conductivity, and
  ii. a second layer with a second conductivity;
  iii. an light emitting quantum well region between above said first layer and second layer
 b. a first electrical contact in electrical connection with said first layer;
 c. a second electrical contact in electrical connection with said second layer; and
 d. an template serving as a platform for said ultraviolet light-emitting structure, said template having
  i. a first buffer layer, said buffer layer being trenched, and
  ii. a second buffer layer being coalesced over said first buffer layer, said second buffer layer being made of $Al_xIn_yGa_{1-x-y}N$, wherein $0<x\leq 1$, $0\leq y\leq 1$, $0<x+y\leq 1$,
 whereby, when an electrical potential is applied to said first and second electrical contacts, said device emits ultraviolet light wherein the first buffer layer comprises $Al_xIn_yGa_{1-x-y}N$ wherein $0.1<x\leq 1$, $0\leq y\leq 1$, $0.1\leq x+y\leq 1$.

18. The light emitting device of claim 17 wherein the first buffer comprises $Al_xIn_yGa_{1-x-y}N$ wherein $0.25<x\leq 1$, $0\leq y\leq 1$, $0.25\leq x+y\leq 1$.

19. The light emitting device of claim 18 wherein the first buffer layer comprises $Al_xIn_yGa_{1-x-y}N$ wherein $0.5<x\leq 1$, $0\leq y\leq 1$, $0.5\leq x+y\leq 1$.

20. The light emitting device of claim 19 wherein the first buffer layer comprises $Al_xIn_yGa_{1-x-y}N$ wherein $0.9<x\leq 1$, $0\leq y\leq 1$, $0.9\leq x+y\leq 1$.

21. The light emitting device of claim 20 wherein the first buffer layer comprises $Al_xIn_yGa_{1-x-y}N$ wherein $0.99<x\leq 1$, $0\leq y\leq 1$, $0.99\leq x+y\leq 1$.

22. A light-emitting device comprises of a
 a. an ultraviolet light-emitting structure having
  i. a first layer with a first conductivity, and
  ii. a second layer with a second conductivity;
  iii. an light emitting quantum well region between above said first layer and second layer
 b. a first electrical contact in electrical connection with said first layer;
 c. a second electrical contact in electrical connection with said second layer; and
 d. an template serving as a platform for said ultraviolet light-emitting structure, said template having
  i. a first buffer layer, said buffer layer being trenched, and
  ii. a second buffer layer being coalesced over said first buffer layer, said second buffer layer being made of $Al_xIn_yGa_{1-x-y}N$, wherein $0<x\leq 1$, $0\leq y\leq 1$, $0<x+y\leq 1$,
 whereby, when an electrical potential is applied to said first and second electrical contacts, said device emits ultraviolet light wherein said light emitting structure includes a quantum well region comprising alternating layers of:
 a quantum well comprising $Al_xIn_yGa_{1-x-y}N$ wherein $0\leq x\leq 1$, $0\leq y\leq 1$, and $0\leq x+y\leq 1$, said quantum well having a surface and a band gap; and
 a barrier layer on said surface of said quantum well, said barrier layer having a band gap larger than said band gap of said quantum well, and wherein said barrier layer includes $Al_xIn_yGa_{1-x-y}N$ wherein $0<x\leq 1$, $0\leq y\leq 1$ and $0<x+y\leq 1$, and wherein said quantum well region begins and terminates with said barrier layer wherein said quantum well region comprises a single quantum well and multiple quantum layers.

23. The light emitting device as recited in claim 22, wherein said quantum well and said barrier layer have different compositions.

24. The light emitting device as recited in claim 23, wherein said compositiosn are selected so that said quantum well region emits with a wavelength λ in the range 190 nm≤λ≤240 nm.

25. The light emitting device as recited in claim 22, wherein said quantum well is doped with at least one n-type dopant selected from the group consisting of silicon, indium and carbon.

26. The light emitting device as recited in claim 22, wherein said quantum well is doped with at least one p-type dopant selected from the group consisting of magnesium, zinc and beryllium.

27. The light emitting device as recited in claim 22, wherein said quantum well is doped with at least one n-type and at least one p-type dopant.

28. The light emitting device as recited in claim 22, wherein said quantum well region produces ultra-violet photons.

29. The light emitting device as recited in claim 22, wherein said compositions are selected so that said quantum well region emits with a wavelength λ in the range 240 nm≤λ≤280 nm.

30. The light emitting device as recited in claim 22 wherein said compositions are selected so that said quantum well region emits with a wavelength λ in the range 280 nm≤λ≤320 nm.

31. The light emitting device as recited in claim 22 wherein said compositions are selected so that said multiple quantum well emits with a wavelength λ in the range 320 nm≤λ≤369 nm.

32. A light-emitting device comprises of a
 a. an ultraviolet light-emitting structure having
  i. a first layer with a first conductivity,
  ii. a second layer with a second conductivity and
  iii. a light emitting quantum well region between said first layer and second layer;
 b. a first electrical contact in electrical connection with said first layer;
 c. a second electrical contact in electrical connection with said second layer; and
 d. a template serving as a platform for said ultraviolet light-emitting structure, said template having
  i. a first buffer layer, said buffer layer being trenched, said first buffer layer being made of $Al_xIn_yGa_{1-x-y}N$, wherein $0<x\leq 1$, $0\leq y\leq 1$ and $0<x+y\leq 1$,
  ii. a second buffer layer being coalesced over said first buffer layer.

33. The light-emitting device as recited in claim 32, wherein said first electrical contact is carried on the said first buffer layer with a first conductivity.

34. The light-emitting device as recited in claim 32, wherein said first electrical contact is carried by said first layer with said first conductivity, and wherein said template further comprises a substrate, said first buffer layer being between said substrate and said second buffer layer.

35. The light-emitting device as recited in claim 34 wherein said substrate has crystallographic orientation along c-plane, A plane, M plane or R plane.

36. The light-emitting device as recited in claim 32, wherein said the first buffer layer is trenched in a pattern.

37. The light emitting device as recited in claim 32, wherein said first buffer layer is trenched to a depth of at least 0.1 μm.

38. The light-emitting device as recited in claim 32, wherein said first electrical contact is made of Ti, Al, Ni, Au, Mo, Ta or a combination of any of these metals as a single layer or multistack layer.

39. The light-emitting device as recited in claim 32, wherein said second electrical contact is made of Pd, Ni, Ag, Au, ITO, NiO, or PdO or a combination of any of these metals as a single layer or multistack layer.

40. A light-emitting device comprises of a
   a. an ultraviolet light-emitting structure having
       i. a first layer with a first conductivity,
       ii. A second layer with a second conductivity and
       iii. A light emitting quantum well region between said first layer and second layer;
   b. a first electrical contact in electrical connection with said first layer;
   c. a second electrical contact in electrical connection with said second layer; and
   d. a template serving as a platform for said ultraviolet light-emitting structure, said template having
       i. a first buffer layer, said buffer layer being trenched, said first buffer layer being made of $Al_xIn_yGa_{1-x-y}N$, wherein $0<x\leq 1$, $0\leq y\leq 1$ and $0<x+y\leq 1$, and
       ii. a second buffer layer being coalesced over said first buffer layer wherein said second buffer layer further comprises:
   a first sub-layer coalesced over said first buffer layer to form a first planar layer; and
   a second sub-layer applied to said first sub-layer, said first and said second sub-layers being made of $Al_xIn_yGa_{1-x-y}N$, wherein $0<x\leq 1$, $0\leq y\leq 1$ and $0<x+y\leq 1$.

41. The light-emitting device as recited in claim 40 wherein said second sub-layer is a superlattice layer.

42. The light-emitting device as recited in claim 40, further comprising a third sub-layer, wherein said third sub-layer is a superlattice layer made of $Al_xIn_yGa_{1-x-y}N$, wherein $0<x\leq 1$, $0\leq y\leq 1$ and $0<x+y\leq 1$.

43. The light-emitting device as recited in claim 42, further comprising a fourth sub-layer.

44. A light-emitting device comprises of a
   a. an ultraviolet light-emitting structure having
       i. a first layer with a first conductivity,
       ii. a second layer with a second conductivity and
       iii. a light emitting quantum well region between said first layer and second layer;
   b. a first electrical contact in electrical connection with said first layer;
   c. a second electrical contact in electrical connection with said second layer; and
   d. a template serving as a platform for said ultraviolet light-emitting structure, said template having
       i. a first buffer layer, said buffer layer being trenched, said first buffer layer being made of $Al_xIn_yGa_{1-x-y}N$, wherein $0x\leq 1$, $0\leq y\leq 1$ and $0<x+y\leq 1$, and
       ii. a second buffer layer being coalesced over said first buffer layer wherein said first electrical contact is carried by said first layer with said first conductivity,
   wherein said template further comprises a substrate, said first buffer layer being between said substrate and siad second buffer layer,
   wherein said substrate has crystallographic orientation along c-plane, A plane, M plane or R plane; and
       wherein said substate has a mis-orientation less that 10° from its axis.

45. The light-emitting device as recited in claim 44 wherein said first buffer layer is grown on said substrate, said substrate having a root mean square roughness ranging from 1 Å to 100 micron.

\* \* \* \* \*